United States Patent [19]

Fujimoto

[11] Patent Number: 4,766,563

[45] Date of Patent: Aug. 23, 1988

[54] AUTO-CORRELATION FILTER

[75] Inventor: Yoshiji Fujimoto, Nara, Japan

[73] Assignee: Sharp Kabushiki Kaisha, Osaka, Japan

[21] Appl. No.: 785,515

[22] Filed: Oct. 8, 1985

[30] Foreign Application Priority Data

Oct. 17, 1984 [JP] Japan .................................. 59-219240

[51] Int. Cl.⁴ ......................... G06F 7/38; G01R 23/16
[52] U.S. Cl. ..................................... 364/724; 364/728
[58] Field of Search ............... 364/724, 728, 715, 819, 364/807, 825; 342/189, 192

[56] References Cited

U.S. PATENT DOCUMENTS 4,158,234 6/1979 Grandchamp ...................... 364/715
4,404,645 9/1983 Elings et al. ......................... 364/728

OTHER PUBLICATIONS

IEEE Transactions On Industrial Electronics, vol. IE-29, No. 1, Feb. 1982, pp. 73-82, IEEE, New York, U.S.; Ganesan et al., "A Real-Time Digital Signal Analyzer Correlator Averager Power Spectral Density Analyzer".

Primary Examiner—Gary V. Harkcom
Assistant Examiner—Tan V. Mai
Attorney, Agent, or Firm—Birch, Stewart, Kolasch, & Birch

[57] ABSTRACT

A digital filter for obtaining the power of a filtered signal passing through a particular frequency band for each frame (short time division) includes an auto-correlation circuit for calculating the auto-correlation function of the input signal, and a sum of products calculator for obtaining the power of the signal by multiplying a linear coefficient with the auto-correlation function for the frame and summing the products together to get the power of the filtered signal.

10 Claims, 14 Drawing Sheets

AUTO-CORRELATION FILTER

BACKGROUND OF THE INVENTION

1. Field of the Invention

The present invention relates to a filter for outputting the power of a signal passing through a specified frequency band for each frame (short time division).

2. Description of the Prior Art

In spectrum analysis and sound identification, FFT (fast fourier transform) and digital filter are two typical means for obtaining the power of a signal of a particular frequency band through digital processing.

The method that uses FFT is described below. First, a signal waveform is operated upon by the FFT to calculate the power of each frequency component. Then, the powers of the frequency components corresponding to the passing band of the filter are multiplied by the frequency characteristic of the filter and summed up, so that the power for each frame is obtained. This method is advantageous in that a filter of a desired characteristic is easily realized. The problem is, however, that FFT involves many calculation stages.

The method using a digital filter is described below. After a signal is passed through a specified filter, the square-law detection is conducted on the waveform. Then, the signal is passed through a low-pass-filter to sample the power for each frame. Referring to FIG. 1, an analog signal 101 is converted by an analog/digital converter 102 to a digital signal 103 which is passed through a digital filter 104 with a specified frequency characteristic so as to obtain a signal 105 having the passing band frequency component. Then, the signal 105 is passed through a square-law detector 106 to square the signal value, thus obtaining an instantaneous power signal 107. The signal 107 is then passed through an anti-alias low-pass-filter 108 to obtain a reflected noise-free signal 109 which is sampled by a sampling circuit 110 at frame intervals to obtain output power 111.

Though this digital filter method involves fewer calculation stages, it is necessary to increase the number of degrees of the digital filter to improve the blocking characteristic of the filter, resulting in increased calculations after all. In addition, calculation stages increase in proportion to the number of filter channels.

OBJECTS AND SUMMARY OF THE INVENTION

1. Objects of the Invention

Accordingly, an object of the present invention is to provide a novel auto-correlation filter which requires minimum calculation stages.

Another object of the present invention is to provide a filter for calculating the power of a specified frequency band for each frame, the filter effectively realizing an auto-correlation filter by a minimum number of calculation stages and using an auto-correlation function.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

2. Summary of the Invention

To achieve the above objectives, pursuant to an embodiment of the present invention, a digital filter for obtaining the power of a filtered signal passing through a particular frequency band for each frame (short time division) includes an auto-correlation circuit for calculating the auto-correlation function of the input signal, and a sum of product calculator for obtaining the power of the signal by multiplying a linear coefficient with the auto-correlation function for the frame and summing the products together to get the power of the filtered signal.

The number of the calculation stages involved in the filter of the present invention is obtained by the following formulas in which N is the number of sampling points in one frame, and L is the number of channels to be realized, with the assumption that the degree of auto-correlation function is from 0 to M:

(1) Calculation of auto-correlation
Number of times of multiplications: $N \times (M+1)$
Number of times of additions: $(N-1) \times (M+1)$ (2) Calculation of filter power by linear coupling
Number of times of multiplications: $(M+1) \times L$
Number of times of additions: $M \times L$ As understood from these formulas, since M is extremely smaller than N (for example, $N=200$, $M=20$), the entire calculation volume does not increase significantly even if the number of channels L increases. Accordingly, the filter of the present invention is very useful in sound identification and general spectrum analysis operations which require numerous filter channels.

Further, the filter whose calculation mainly consists of sum of products is suitable to a digital single processor that is quick in the sum-of-products calculation.

BRIEF DESCRIPTION OF THE DRAWINGS

The present invention will be better understood from the detailed description given hereinbelow and the accompanying drawings which are given by way of illustration only, and thus are not limitative of the present invention and wherein.

DESCRIPTION OF THE PREFERRED EMBODIMENTS

Figure 1:
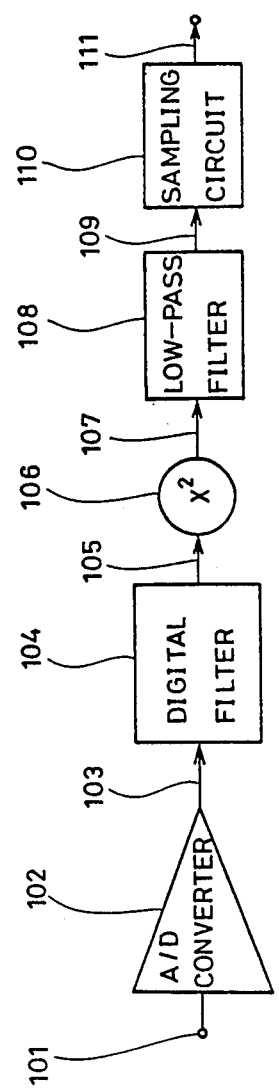
FIG. 1 is a block diagram of a conventional digital filter circuit.

An embodiment of the present invention will be described in details in the order of:
A: Principle and Advantageous Feature
B: Example of Filter Design
C: Specific Construction

A. Principle and Advantageous Feature

Auto-correlation function $\phi(\tau)$ and power spectrum $\Phi(\omega)$ have such well-known correlation as expressed by the equations (1) and (2) below.

$$\phi(\tau) = \int_0^\infty \Phi(\omega)\cos\omega\tau d\omega \qquad (1)$$

$$\Phi(\omega) = 2 \int_0^\infty \phi(\tau)\cos\omega\tau d\tau \qquad (2)$$

For application to sampled digital signals, these equations are transformed as follows, by using the auto-correlation function for the short time division (frame) in a discrete time system:

$$\phi(\tau) = \frac{1}{N} \sum_{k=0}^{N-1} \Phi(k)\cos\frac{2\pi tk}{N} \qquad (3)$$

$$\Phi(k) = \sum_{t=0}^{N-1} \phi(t)\cos\frac{2\pi tk}{N} \qquad (4)$$

Here, $$\phi(t) = \sum_{n=0}^{N-1} Sm(n) \cdot Sm(n + t) \qquad (5)$$

in which Sm(n) is a sampled input signal series in the "m"th frame and is equal to Sm(n+N), and N is the number of sampling points in one frame.

Supposing F(k) is an ideal frequency characteristic of a filter to be designed, the output power $P_F$ of each frame of the filter is expressed in the following equation in which products of F(k) and $\Phi(k)$ are summed up for "k":

$$P_F = \tfrac{1}{2} \sum_{k=0}^{N-1} F(k) \cdot \Phi(k) \qquad (6)$$

If this equation is expanded using the equation (4), the following equation is obtained.

$$\begin{aligned} P_F &= \tfrac{1}{2} \sum_{k=0}^{N-1} F(k) \left( \sum_{t=0}^{N-1} \phi(t)\cos\frac{2\pi tk}{N} \right) \\ &= \tfrac{1}{2} \sum_{t=0}^{N-1} \phi(t) \left( \sum_{k=0}^{N-1} F(k) \cdot \cos\frac{2\pi tk}{N} \right) \\ &= \tfrac{1}{2} \sum_{t=0}^{N-1} a(t) \cdot \phi(t) \end{aligned} \qquad (7)$$

It is understood from the above that the output power $P_F$ of the filter is the linear coupled auto-correlation function $\phi(t)$. Here, $$a(t) = \sum_{k=0}^{N-1} F(k) \cdot \cos\frac{2\pi tk}{N} \qquad (8)$$

That is, a(t) is a cosine transformation of F(k). By inverse cosine transformation, the following equation is obtained:

$$F(k) = \frac{1}{N} \sum_{t=0}^{N-1} a(t) \cdot \cos\frac{2\pi tk}{N} \qquad (9)$$

Now, when the auto-correlation function is multiplied by a window function $\omega(t)$ to stop the calculation on the way at a certain degree of the auto-correlation function, the linear coupling coefficient $a\omega(t)$ can be calculated by the equation:

$$a\omega(t) = a(t) \cdot \omega(t) \qquad (10)$$

Assuming the window function $\omega(t)$ is equal to $\omega(-t)$ and that the inverse cosine transformation of $\omega(t)$ is W(k), the filter frequency characteristic Fw(k) multiplied by the window function is obtained by using $a\omega(t)$ in place of a(t) in the equation (9).

$$\omega(t) = \sum_{k=0}^{N-1} W(k)\cos\frac{2\pi tk}{N} \qquad (11)$$

$$W(t) = \frac{1}{N} \sum_{t=0}^{N-1} \omega(t)\cos\frac{2\pi tk}{N} \qquad (12)$$

$$\begin{aligned} Fw(k) &= \frac{1}{N} \sum_{t=0}^{N-1} a\omega(t)\cos\frac{2\pi tk}{N} \\ &= \frac{1}{N} \sum_{t=0}^{N-1} a(t) \cdot \omega(t)\cos\frac{2\pi tk}{N} \end{aligned} \qquad (13)$$

*Refer to the equation (10).

$$= \frac{1}{N} \sum_{t=0}^{N-1} \left( \sum_{i=0}^{N-1} F(i)\cos\frac{2\pi ti}{N} \right)$$

$$\left( \sum_{j=0}^{N-1} W(j)\cos\frac{2\pi tj}{N} \right) \times \cos\frac{2\pi tk}{N}$$

*Refer to the equations (8) and (11).

$$= \sum_{i=0}^{N-1} F(i) \sum_{j=0}^{N-1} W(j) \left( \frac{1}{N} \sum_{t=0}^{N-1} \cos\frac{2\pi tk}{N} \cos\frac{2\pi ti}{N} \times \cos\frac{2\pi tj}{N} \right) \quad (14)$$

$$= \sum_{j=0}^{N-1} F(k-j) W(j)$$

Thus, Fw(k) is expressed as a convolution of the original frequency characteristic F(k) and W(k).

The principle of the present invention has been described above. It deserves attention that calculation of auto-correlation function is the same for any frequency characteristic of a filter, except that the linear coupling coefficient for each auto-correlation function is different. Since the degree of a coefficient can be limited by the window function, memory capacity for storing coefficients and calculation stages for linear coupling are reduced.

Consequently, the filter of the present invention is very convenient in realizing a filter bank used for spectrum analysis and sound identification, that is, a multi-channel band-bass-filter. Although the filter may have many channels, calculation is needed only once to the specified degree of the auto-correlation function. Calculation for the linear coupling must be conducted for each channel, but the number of the calculation stages is small. Moreover, since a limited number of linear coupling coefficients determines the frequency characteristic of a filter, the memory for storing coefficients need not have a large capacity.

Unlike an IIR filter, the filter of the present invention does not contain a feedback loop, and therefore does not present a problem such as limit cycle.

B. Example of Filter Design

An example of the band-pass-filter design based on the above principle will be shown in the following.

The filter to be designed has a sampling frequency of 10 kHz, 200 sampling points for a frame, and a passing band of 2,200~2,600 Hz. An ideal filter must have such characteristics that the attenuation in the passing band is 0 dB and in the blocking band is −100 dB.

Figure 5:
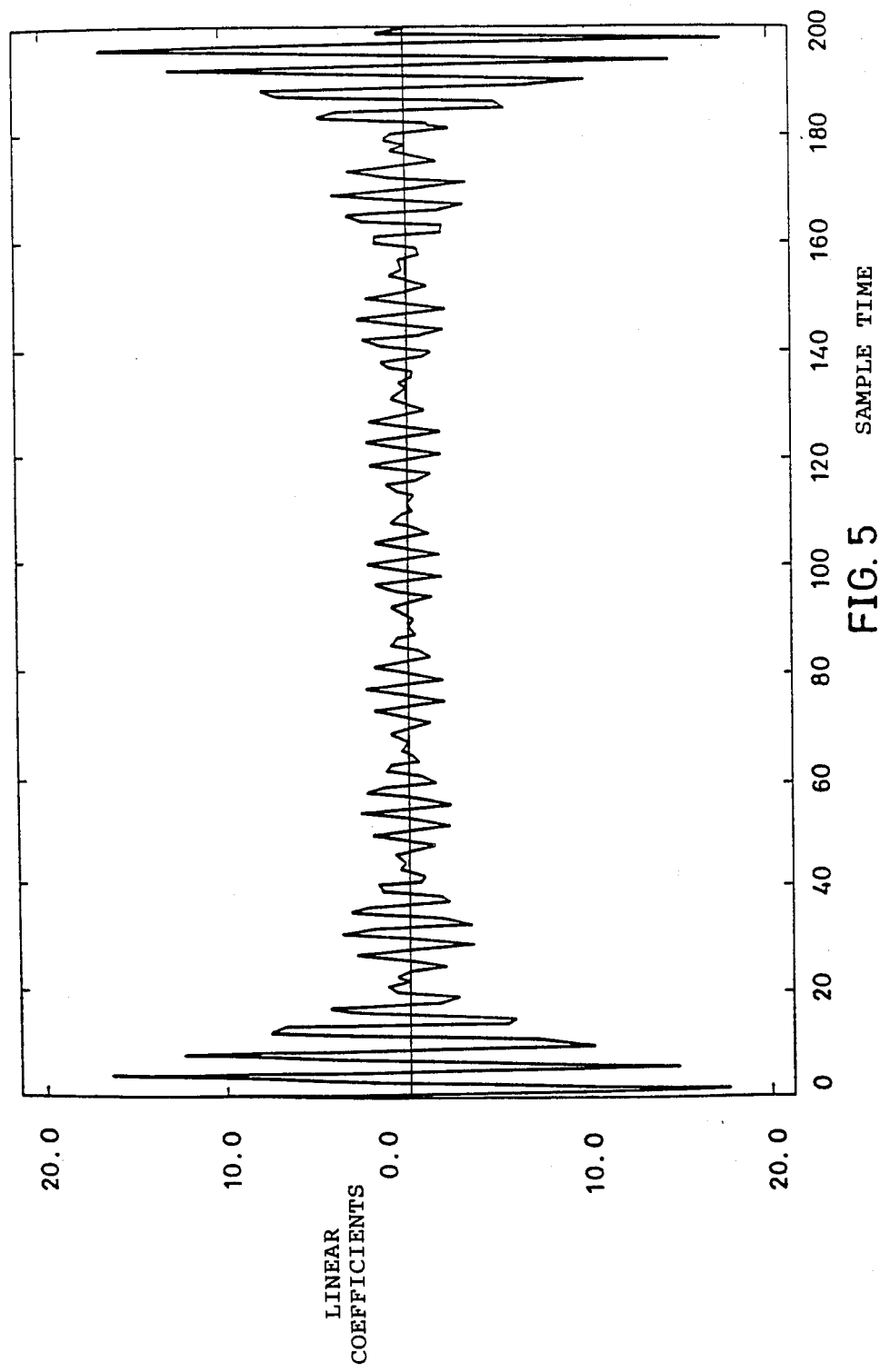
FIG. 5 is a graph showing an example of the linear coupling coefficient of a band pass-filter.

FIG. 5 shows the linear coupling coefficient for the ideal filter characteristics, calculated by the cosine transformation of the equation (8). The coefficient is symmetrical with respect to the 100 sample time. The auto-correlation function itself is also symmetrical. Therefore, sum-of-products calculation is needed only up to the 100 sample time; division by 2 is not necessary.

Figure 6:
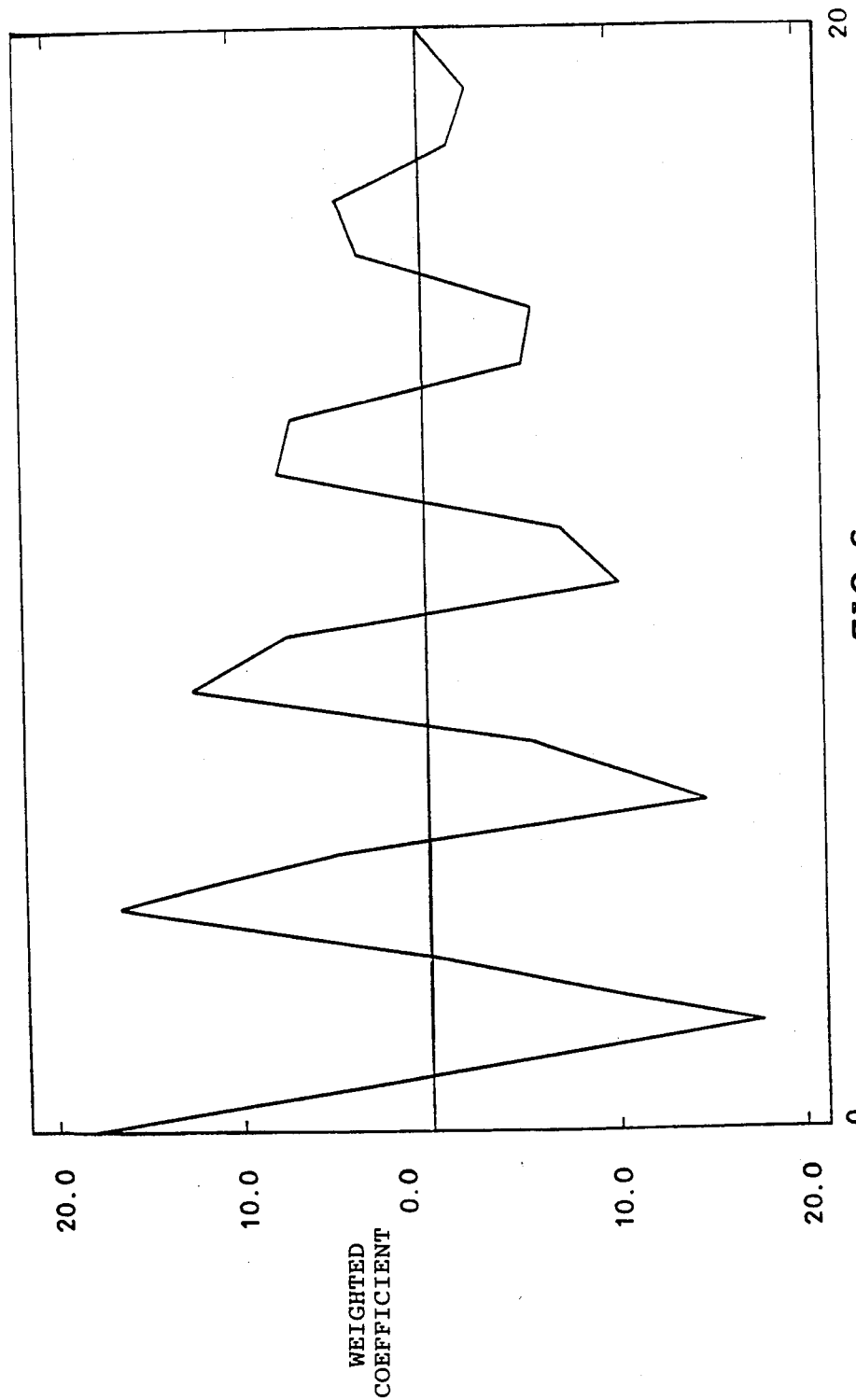
FIG. 6 is a graph showing an example of the linear coupling coefficient multiplied by a rectangular window.
Figure 7:
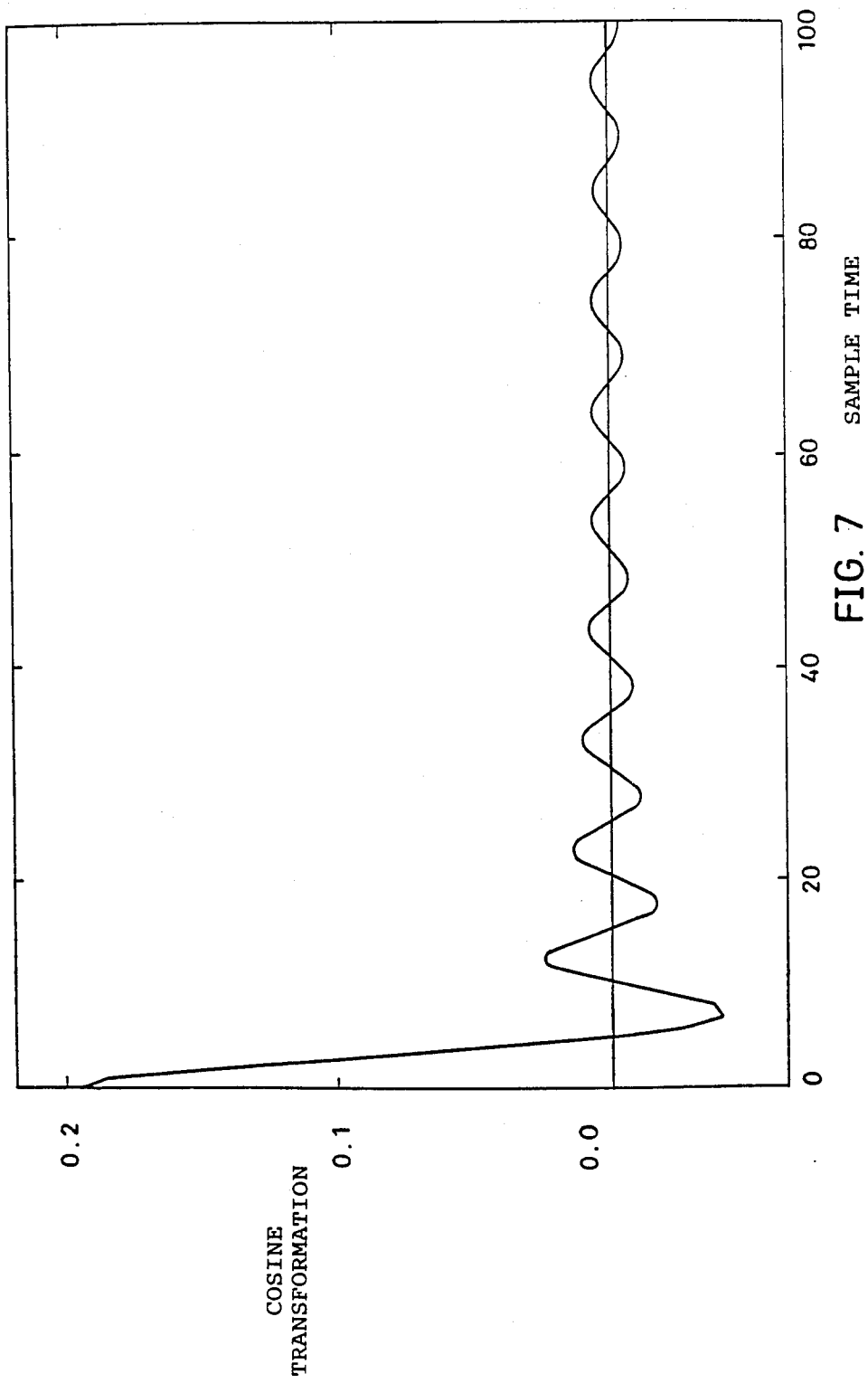
FIG. 7 is a graph showing an example of the cosine transformation result of the rectangular window function.
Figure 8:
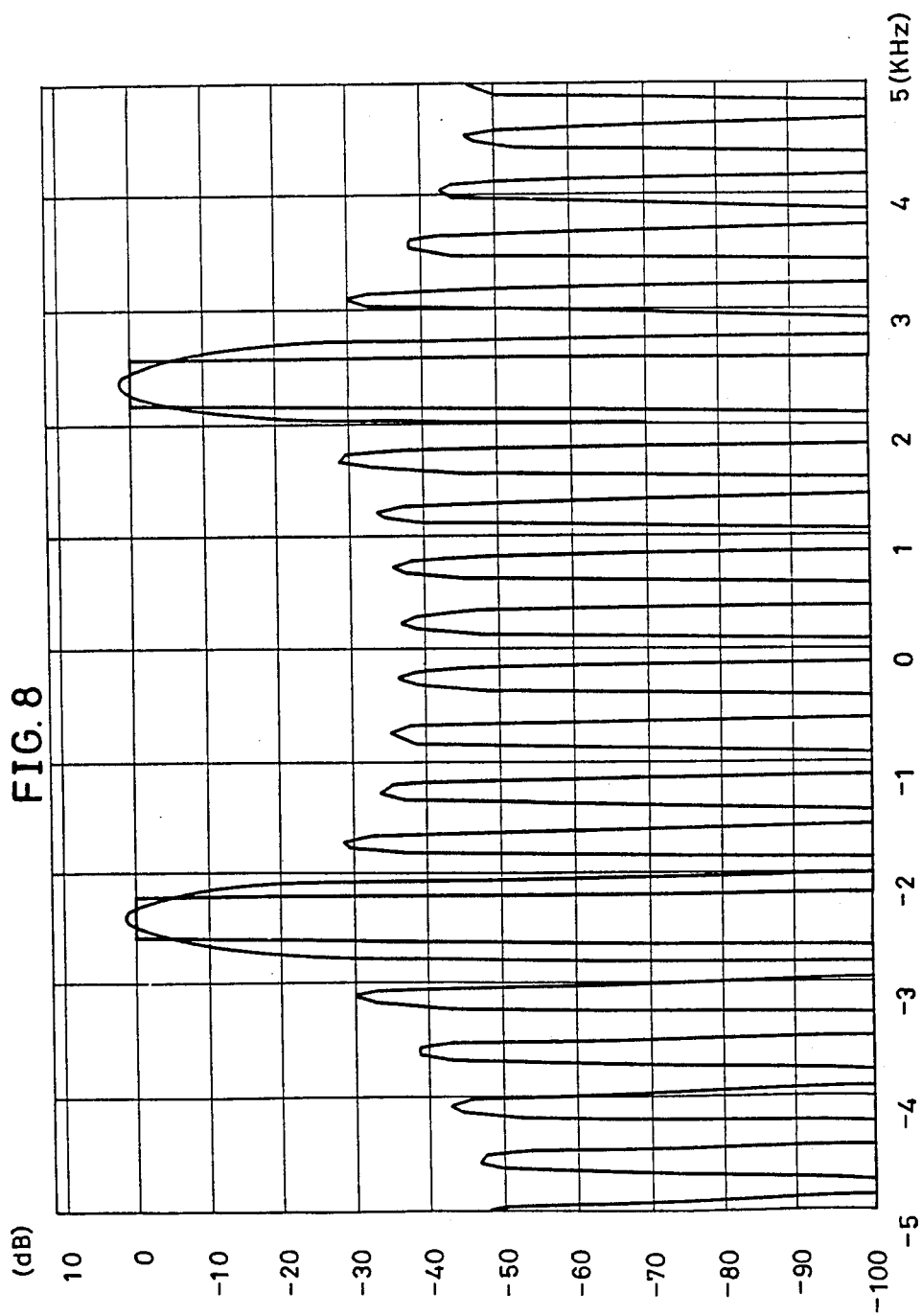
FIG. 8 is a graph showing an example of the filter frequency characteristic when the linear coupling coefficient is multiplied by the rectangular window.

FIG. 6 shows the weighted coefficient of the equation (10), with the value for the auto-correlation function up to the 25 sample time being restricted by a rectangular window. The cosine transformation of the rectangular window is shown in FIG. 7. Calculation of the convolution equation (14) for the cosine transformation of the rectangular window and the ideal filter frequency characteristic yields the frequency characteristic multiplied by the rectangular window as shown in FIG. 8. This frequency characteristic with a large (−30 dB) side lobe can be improved by raising the degree of the auto-correlation function. In FIG. 8, the thick lines indicate an ideal band-pass-filter.

Figure 9:
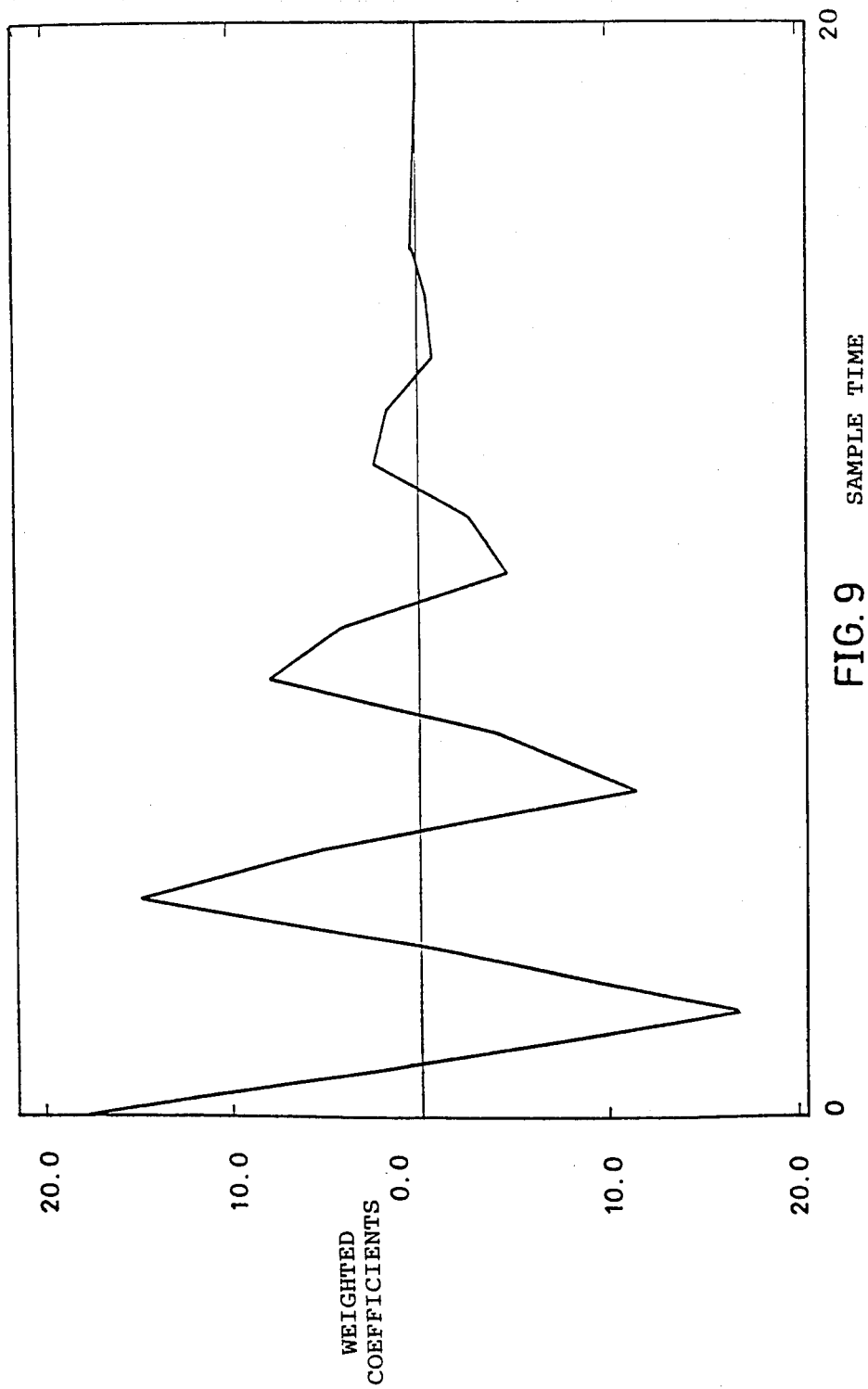
FIG. 9 is a graph showing an example of the linear coupling coefficient multiplied by a Hanning window.
Figure 10:
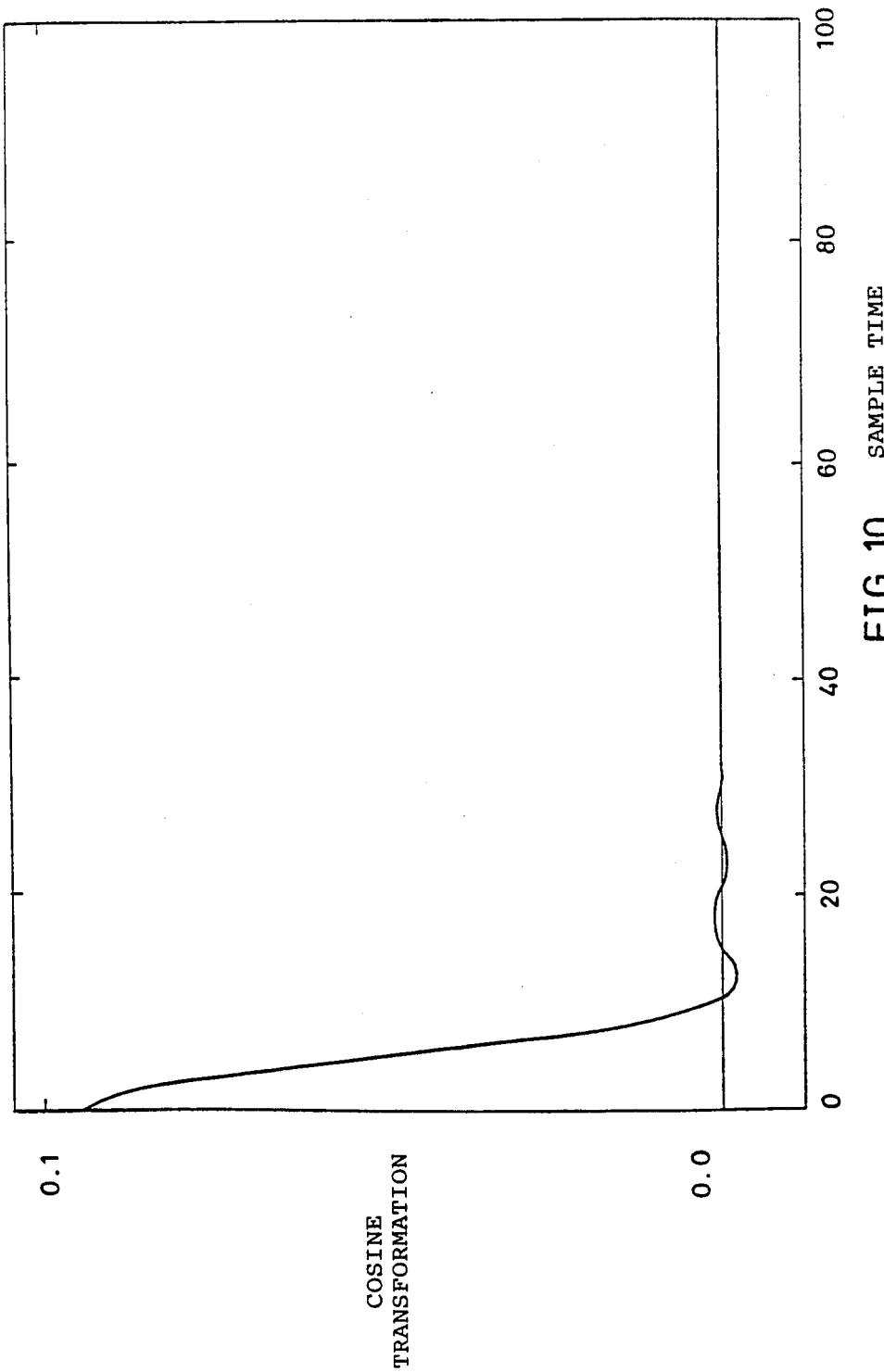
FIG. 10 is a graph showing an example of the cosine transformation result of the Hannning window.
Figure 11:
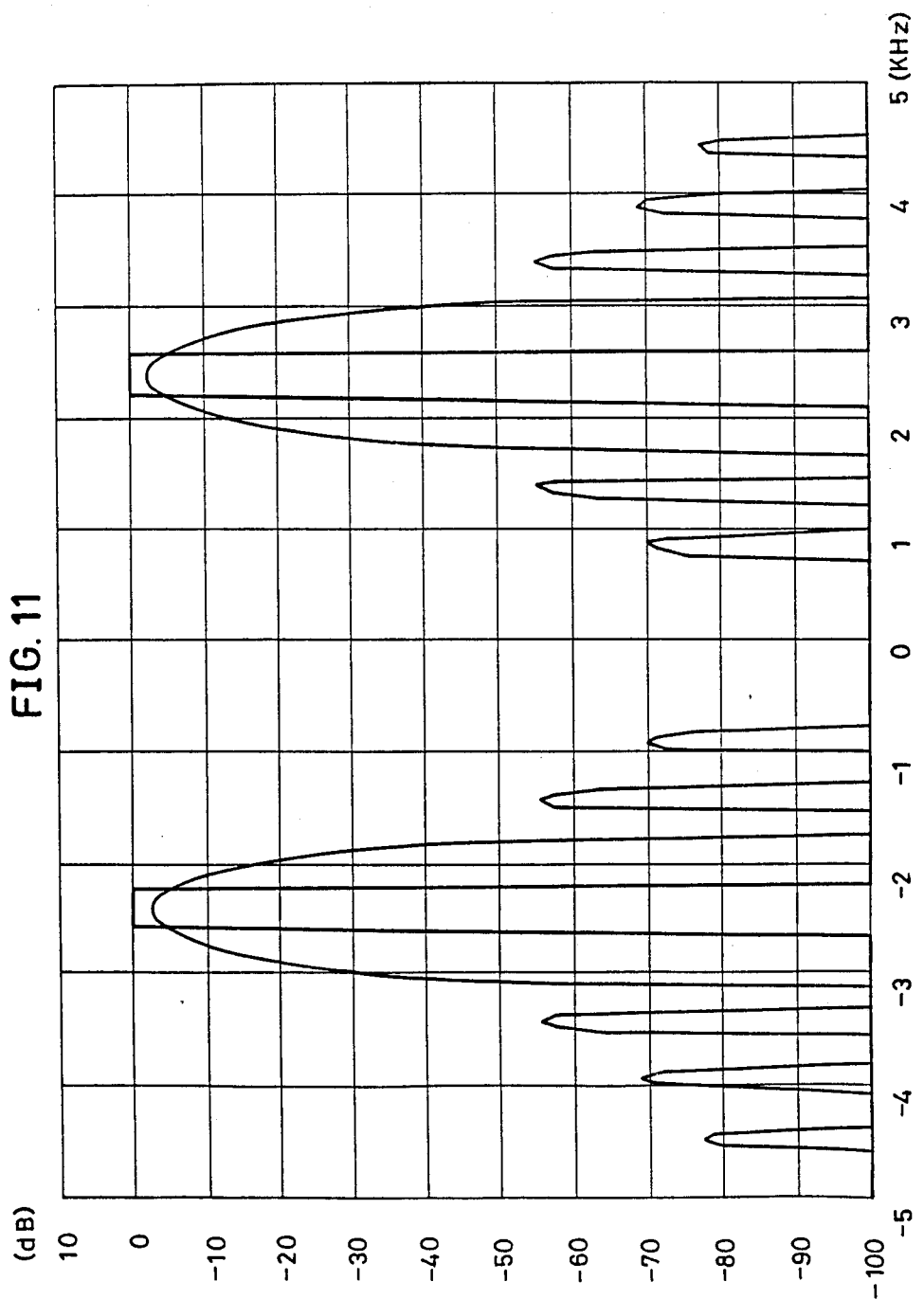
FIG. 11 is a graph showing an example of the filter frequency characteristic when the linear coupling coefficient is multiplied by the Hanning window.
Figure 12:
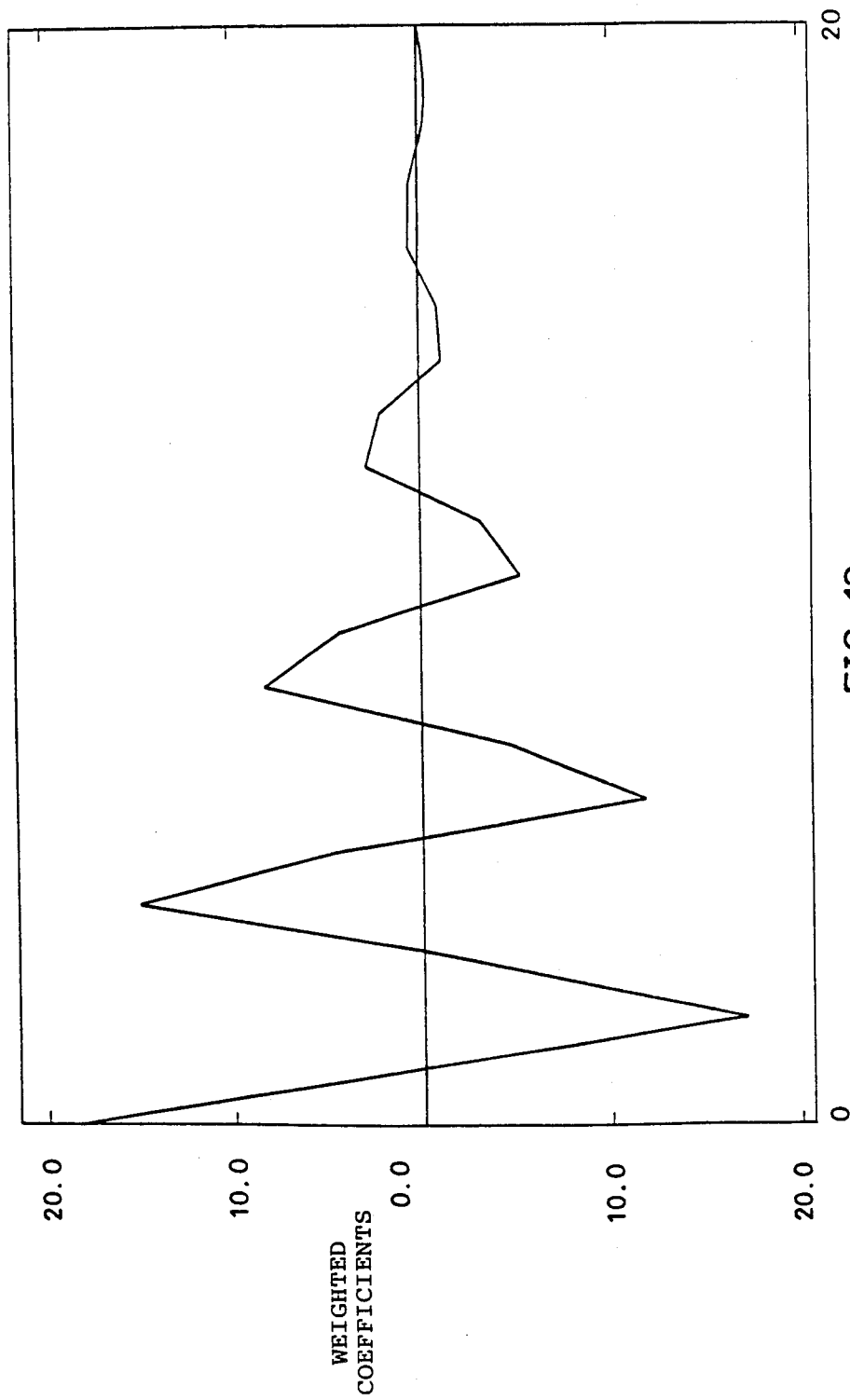
FIG. 12 is a graph showing an example of the linear coupling coefficient multiplied by a Hamming window.
Figure 13:
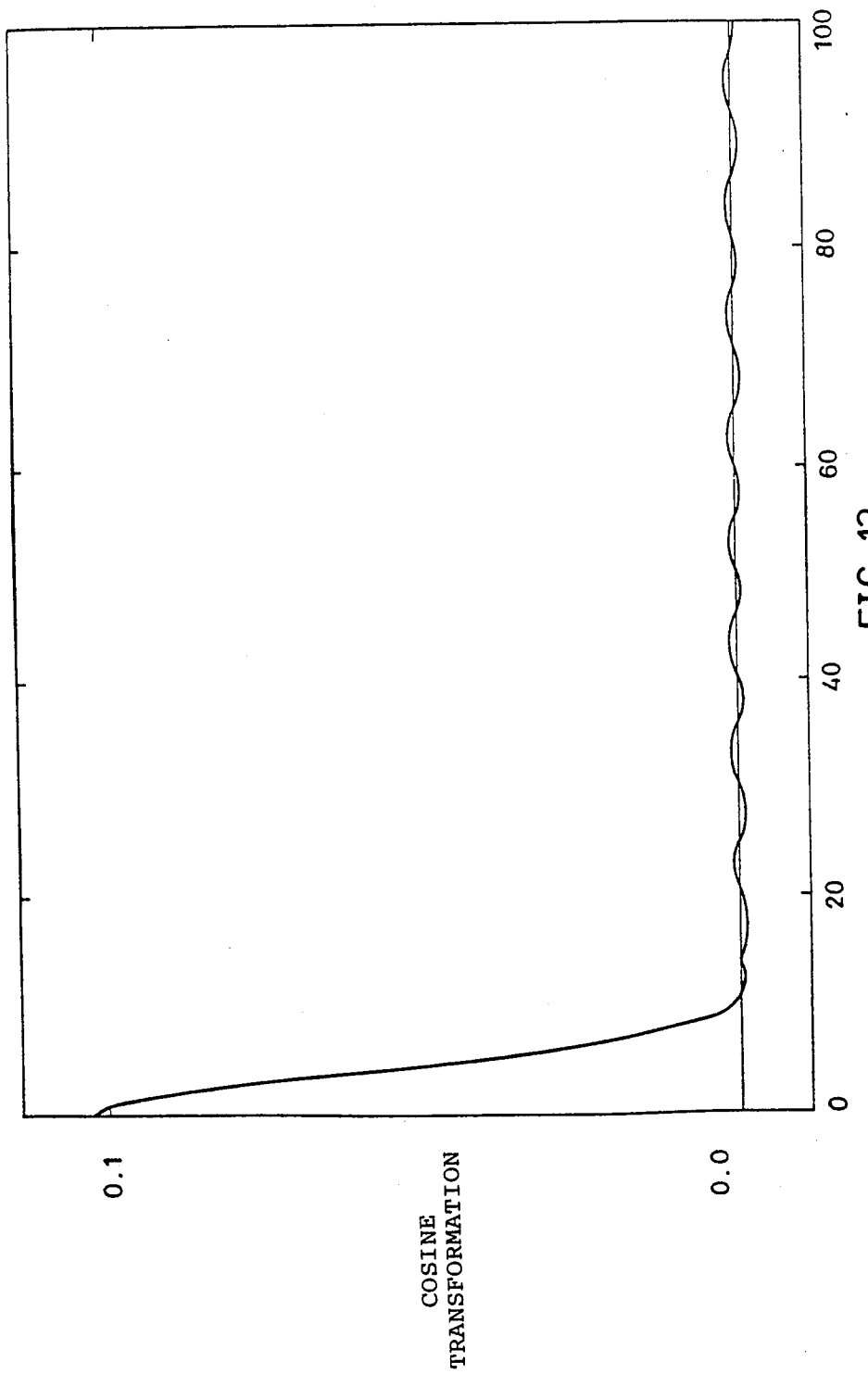
FIG. 13 is a graph showing an example of the cosine transformation result of the Hamming window.

The linear coupling coefficient of the auto-correlation function restricted by a Hanning window instead of the rectangular window, the cosine transformation of the Hanning window and the frequency characteristic are shown in FIGS. 9, 10 and 11, respectively. The linear coupling coefficient of the auto-correlation function restricted by a Hamming window, the cosine transformation of the Hamming window and the frequency characteristic are shown in FIGS. 12, 13 and 14, respectively.

Figure 14:
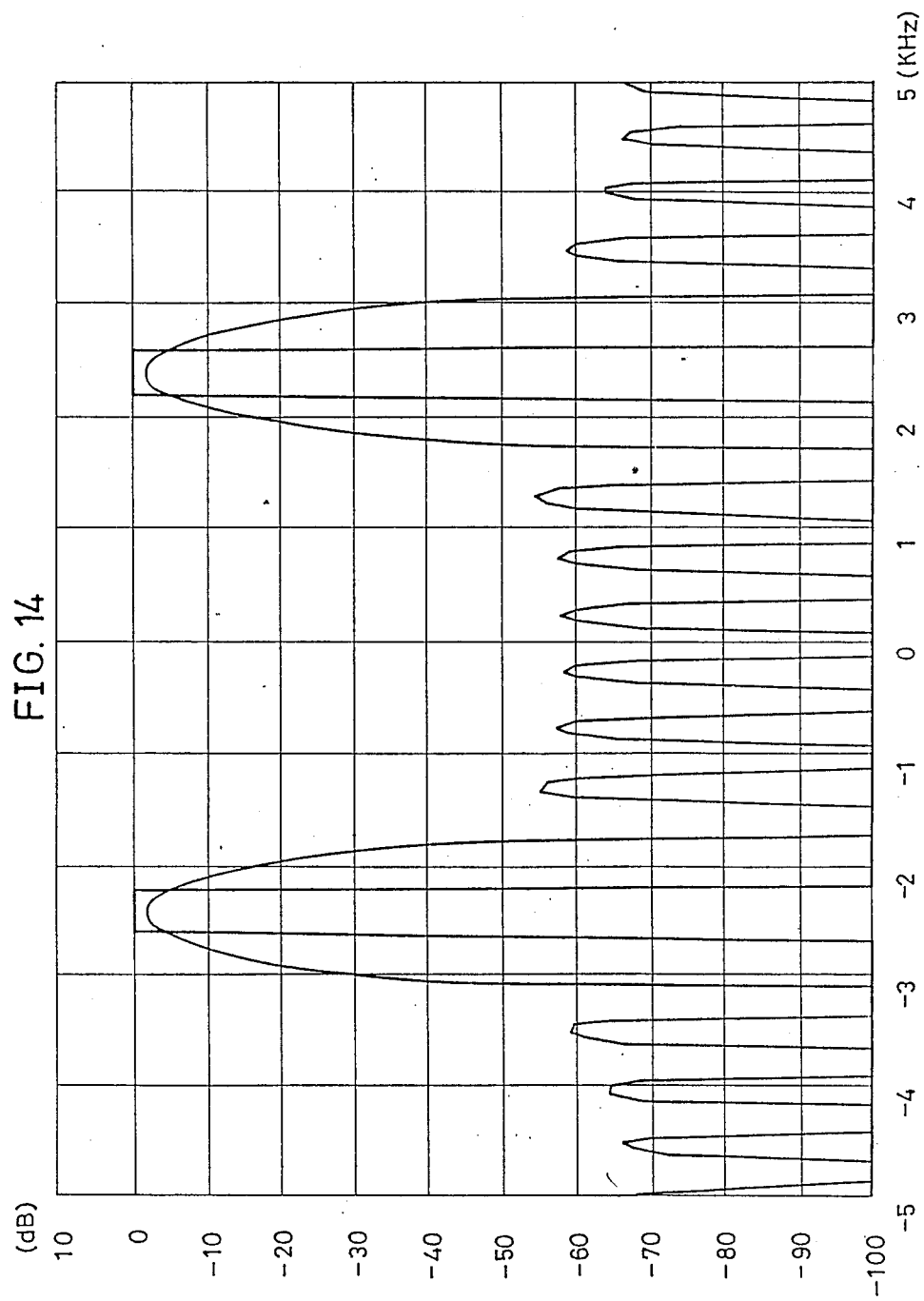
FIG. 14 is a graph showing an example of the filter frequency characteristic when the linear coupling coefficient is multiplied by the Hamming window.

The frequency characteristics in FIGS. 11 and 14 have very small side lobes (−55 dB) but present very wide passing bands. In designing the filter of the present invention, it is necessary to select a suitable degree for the auto-correlation function and an appropriate window function according to the purpose.

C. Specific Construction

Specific construction of the above auto-correlation filter design will be described in the following.

For explanatory purpose, the degree of the auto-correlation function for the filter of the present invention is assumed to be 0 to 9.

Figure 2:
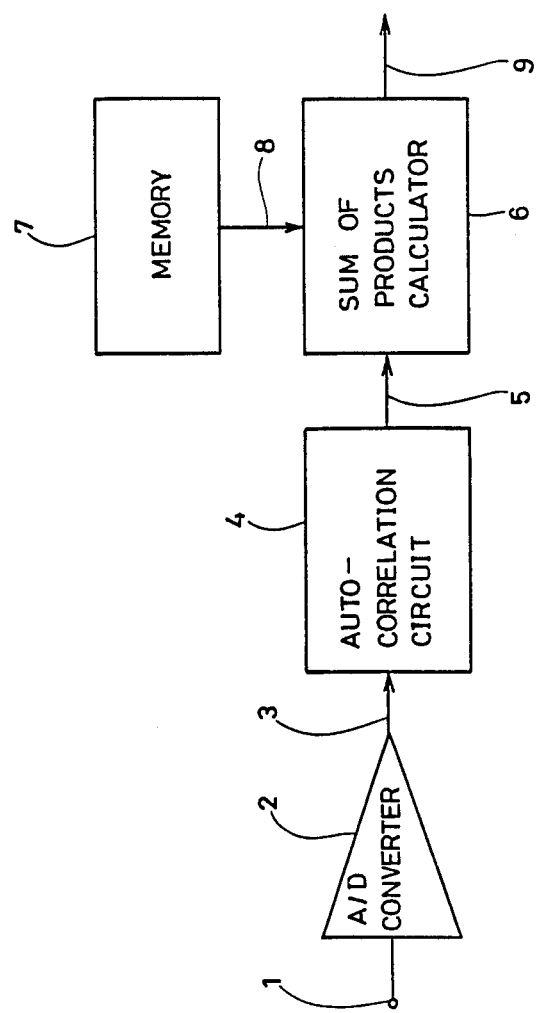
FIG. 2 is a block diagram of an embodiment of a filter of the present invention.

FIG. 2 shows the entire construction of a filter of the present invention. An analog signal input from an input terminal 1 is converted to a digital signal 3 by an analog/digital converter 2. The digital signal 3 enters an auto-correlation circuit 4 where the auto-correlation function is calculated for each frame and outputted. The auto-correlation function 5 enters a sum-of-products calculator 6 where it is multiplied by a linear coupling coefficient 8 read from a memory 7 and the products are summed up as indicated by the equation (7). The sum 9 is outputted as the power of the filter.

If the memory 7 has stored coefficients for plural kinds of auto-correlation filters, the outputs of a plurality of auto-correlation filters are easily obtained by conducting sum-of-products calculation for the auto-correlation functions and the coefficients sequentially read from the memory 7.

Now, the circuit of the auto-correlation filter and the operation timing will be described in detail with reference to FIGS. 3 and 4. In this description, it is assumed that the memory 7 stores auto-correlation filter coefficients for 8 channels.

Figure 3:
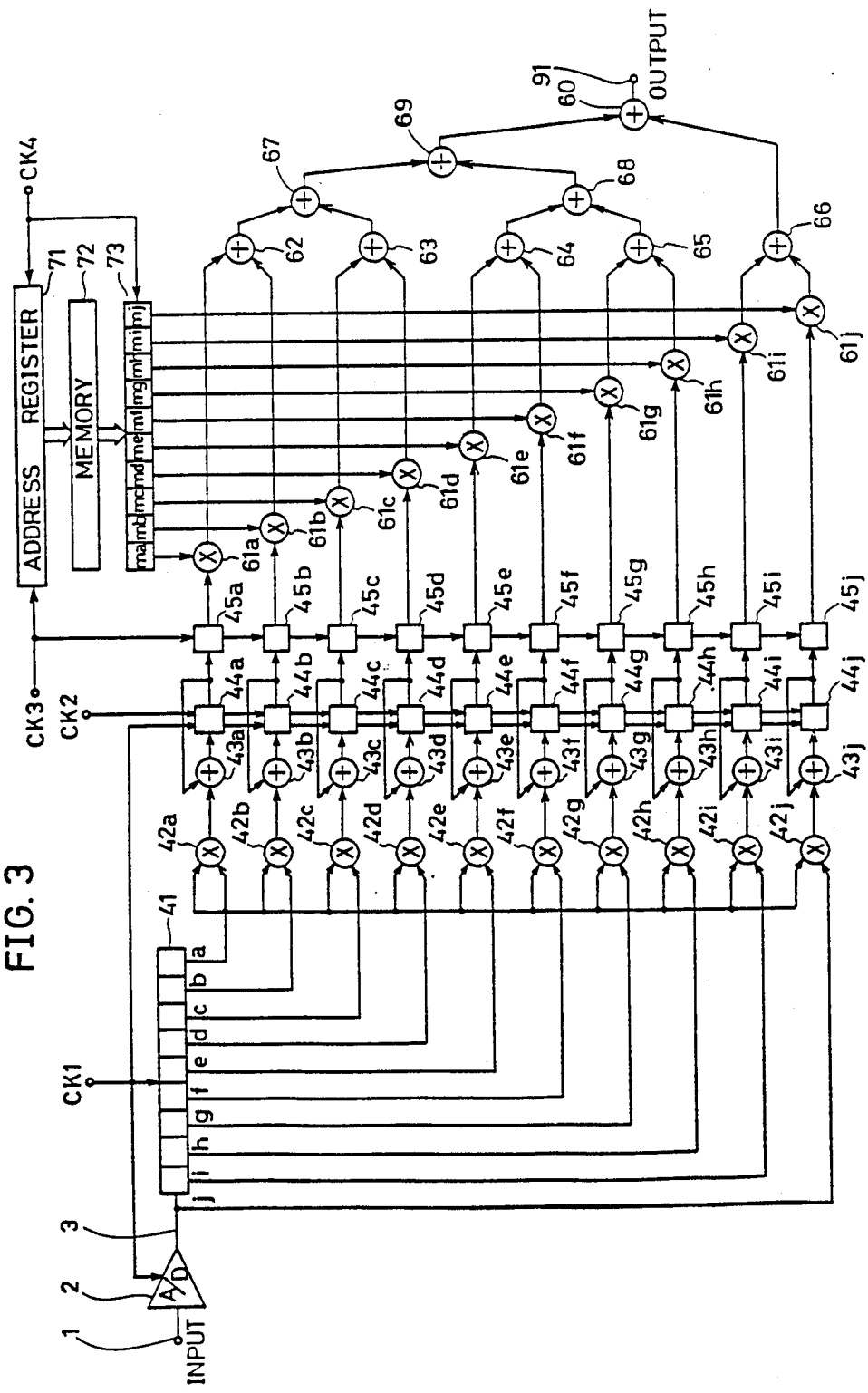
FIG. 3 is a circuit diagram of the filter of FIG. 2.
Figure 4:
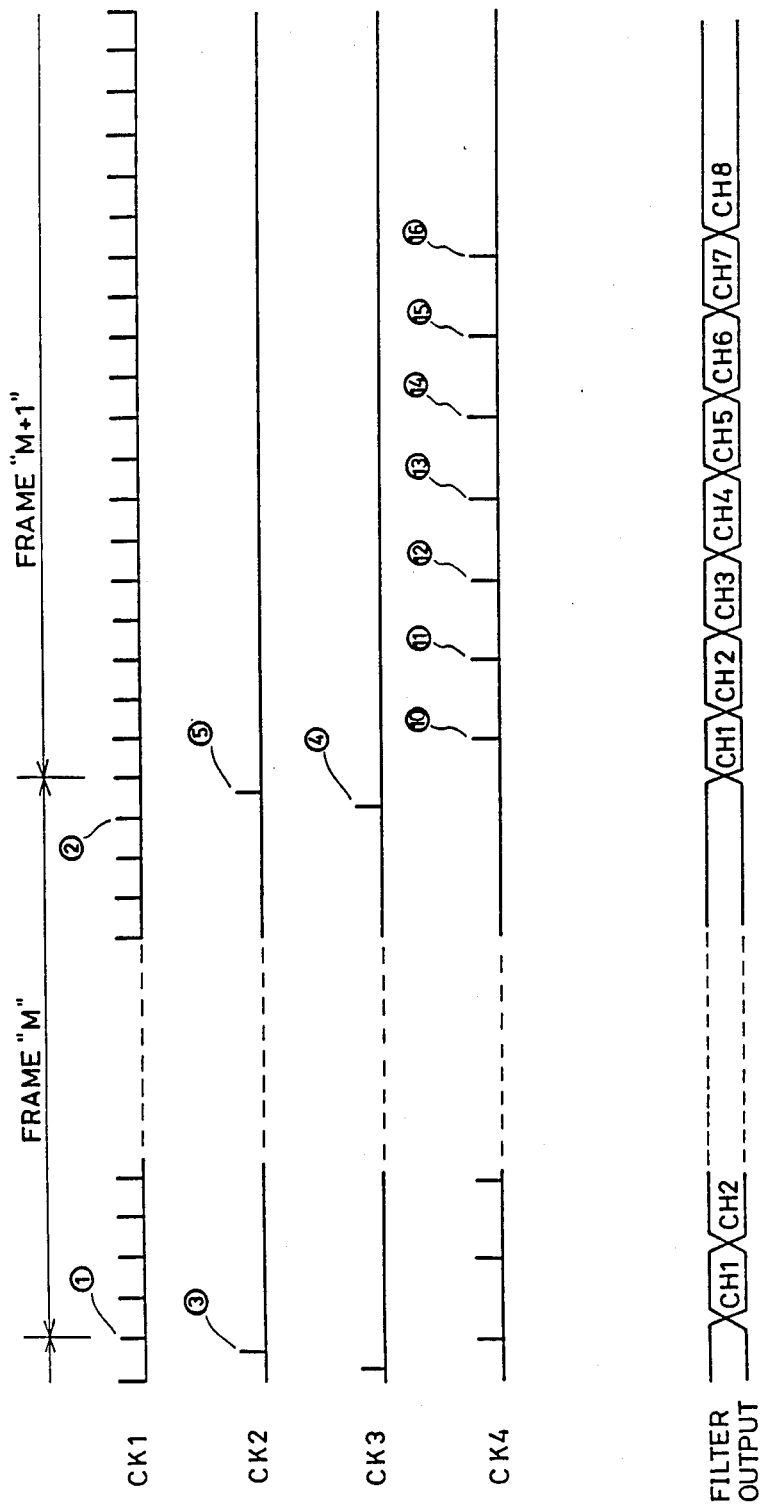
FIG. 4 is an operation timing chart of the filter of FIG. 3.

In FIG. 3, analog signal inputs 1 are converted by an A/D converter 2 to digital signals 3 which are stored in a shift register 41. The shift register 41 and the A/D converter 2 are operated synchronously with a sampling clock signal CK1 which is continually supplied at a constant interval as shown in FIG. 4. Frames are set for calculating the power of the auto-correlation filter. The number of sampling points for one frame is N in the equation (5). In FIG. 4, the "m"th frame comprises the sampling pulses from ① to ②.

Among the digital signals 3 stored in the shift register 41, the last data "a" and an appropriate data "b"~"j" for each stage are transmitted to respective multipliers 42a~42j where the auto-correlation function is calculated. For calculation of the auto-correlation function of the 0th degree, the last data "a" of the shift register 41 is squared. For calculation of the auto-correlation function of the 1st degree, the last data "a" is multiplied by the data "b". Thus, auto-correlation functions of up to the 9th degree are calculated by multiplying the last data "a" and the data "c"~"j" for the respective stages in turn. The data outputs from the multipliers 42a~42j are supplied to the corresponding adders 43a~43j to obtain the sum for one frame.

In the adders 43a~43j, outputs from the corresponding multipliers 42a~42j are added to the outputs from the corresponding registers 44a~44j of the next stage, the results being supplied to the corresponding registers 44a~44j which retain partial sums. The partial sum registers 44a~44j are cleared by the pulse ③ of the clock signal CK2 shown in FIG. 4. Thereafter, the outputs from the adders 43a~43j are set by the clock pulses (from ① to ②) of the clock signal CK1 as partial sums for one frame. The partial sum set by the last clock pulse ② for one frame is the total sum or the auto-correlation function for the frame.

The partial sum registers 44a~44j transfer the auto-correlation functions to the following auto-correlation registers 45a~45j by the pulse ④ of the clock signal CK3, so that the partial sum registers 44a~44j are available for calculation for the next frame. After this data transfer, the partial sum registers 44a~44j are cleared by the pulse ⑤ of the clock signal CK2 to be available for retaining the partial sums for the next frame.

Meanwhile, an address register 71 of the memory 72 is initialized for the address that stores the linear coupling coefficients $a_1(t)$ of the No. 1 channel by the pulse ④ of the clock signal CK3. Given this address, the memory 72 outputs linear coupling coefficients $a_1(0)$, $a_1(1)$, ... $a_1(9)$ of the No. 1 channel, the values being set in the respective areas of a memory register 73 by the pulse ⑩ of the clock signal CK4. Simultaneously, the address register 71 is counted up by one by the pulse ⑩ of the clock signal CK4 so as to designate the address storing the linear coupling coefficients $a_2(t)$ of the No. 2 channel. Similarly, by the pulses ⑪ ~ ⑯ of the clock signal CK4, linear coupling coefficients of the subsequent channels are read from the memory 72 and set in the memory register 73 in turn.

The auto-correlation functions preliminarily calculated and retained in the auto-correlation registers 45a~45j are multiplied by the corresponding linear coupling coefficients set in the memory register 73 in respective multipliers 61a~61j. Specifically, the multiplier 61a multiplies the auto-correlation function of the 0th degree stored in the auto-correlation register 45a and the linear coupling coefficient $a_1(0)$ stored in the area "ma" of the memory register 73. Thus, the auto-correlation functions of the 1st to the 9th degree are sequentially multiplied by $a_1(1)$ ..., and $a_1(9)$ in the multipliers 61a~61j, and the products are outputted.

The product outputs are summed up by adders 62~69 and 60, and the total sum is outputted from an output terminal 91 as a filter output. As shown in FIG. 4, the output terminal 91 outputs power CH1 of the No. 1 channel of the filter at first. Powers CH2~CH8 of the No. 2~No. 8 channels of the filter are outputted in turn as linear coupling coefficients for these channels are set in the memory registers by the clock pulses ⑩ ~ ⑯ of the clock signal CK4.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A filter for determining, from an analog signal, the power of a specified frequency band of said analog signal within a predetermined time frame, comprising:
   an analaog-to-digital converter operatively connected to receive said analog signal and converting said analog signal to a digital signal;
   auto-correlation means, responsive to said digital signal, for auto-correlating said digital signal to develop an auto-correlated signal;
   linear coupling coefficient means for developing linear coupling coefficients; and
   a sum of products calculator, responsive to said linear coupling coefficients from said linear coupling coefficient means and to said auto-correlated signal, and weighting said auto-correlated signal with said linear coupling coefficients and developing an output signal representative of the power of said analog signal.

2. A filter as claimed in claim 1, wherein said sum of products calculator multiplies said linear coupling coefficients with said auto-correlation function to obtain a plurality of intermediate products and then sums said intermediate products to obtain said power of said analog signal.

3. A filter as claimed in claim 1 wherein said linear coupling coefficient means is a memory device having said coefficients stored therein.

4. A filter as claimed in claim 1, wherein said linear coupling coefficient means stores a calculated cosine transformation of a characteristic of the specified frequency band of said filter as said linear coupling coefficients.

5. A filter as claimed in claim 4, wherein said auto-correlation function is multiplied by a window function related to said specified frequency band to reduce the number of said linear coupling coefficients to be used in said linear coefficient means by reducing the number of degrees of said auto-correlation function.

6. A filter as claimed in claim 1, wherein said auto-correlation function is multiplied by a window function related to said specified frequency band to reduce the number of said linear coupling coefficients to be used in said linear coefficient means by reducing the number of degrees of said auto-correlation function.

7. A digital filter for determining the power of an inputted digital signal passing through a predetermined frequency band driving a predetermined time division comprising:
   auto-correlation means, operatively connected to receive said inputted digital signal, for calculating an auto-correlation function of said inputted digital signal;
   storing means for storing linear coupling coefficients; and
   calculating means operatively connected to said storing means and said auto-correlation means for developing an output representative of said power of said inputted digital signal.

8. A digital filter as claimed in claim 7, wherein said storing means is a memory device which stores a cosine transformation of said digital filter as said linear coupling coefficients.

9. A digital filter as claimed in claim 7, wherein said calculating means is a sum of products calculator which multiplies said linear coupling coefficients with said auto-correlation function to obtain a plurality of immediate products and then sums said immediate products to develop a representative of said power of said inputted digital signal.

10. A digital filter as claimed in claim 7, wherein said auto-correlation function is multiplied by a window function related to said predetermined frequency band to reduce the number of linear coupling coefficients to be stored in said storing means.

* * * * *